(12) United States Patent
Xiang et al.

(10) Patent No.: US 6,555,453 B1
(45) Date of Patent: Apr. 29, 2003

(54) FULLY NICKEL SILICIDED METAL GATE WITH SHALLOW JUNCTION FORMED

(75) Inventors: Qi Xiang, San Jose, CA (US); Christy Mei-Chu Woo, Cupertino, CA (US); George J. Kluth, Los Gatos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/058,219

(22) Filed: Jan. 29, 2002

Related U.S. Application Data
(60) Provisional application No. 60/265,089, filed on Jan. 31, 2001.

(51) Int. Cl.[7] .......................... H01L 21/28; H01L 21/44
(52) U.S. Cl. ........................ 438/581; 438/197
(58) Field of Search ................... 438/197, 510, 438/580, 581, 582, 583, 301, 303

(56) References Cited

U.S. PATENT DOCUMENTS

| | | | |
|---|---|---|---|
| 6,004,829 A | * | 12/1999 | Chang et al. |
| 6,303,479 B1 | * | 10/2001 | Snyder |
| 6,362,095 B1 | * | 3/2002 | Woo et al. |
| 6,368,950 B1 | * | 4/2002 | Xiang et al. |

* cited by examiner

Primary Examiner—David Nelms
Assistant Examiner—Phuc T Dang

(57) ABSTRACT

Semiconductor devices having fully metal silicided gate electrodes, and methods for making the same, are disclosed. The devices have shallow S/D extensions with depths of less than about 500 Å. The methods for making the subject semiconductor devices employ diffusion of dopant from metal suicides to form shallow S/D extensions, followed by high energy implantation and activation, and metal silicidation to form S/D junctions having metal silicide connect regions and a fully metal silicided electrode.

18 Claims, 5 Drawing Sheets

FULLY NICKEL SILICIDED METAL GATE WITH SHALLOW JUNCTION FORMED

RELATED APPLICATIONS

This application claims priority from Provisional Application Ser. No. 60/265,089 filed on Jan. 31, 2001, the entire disclosure of which is hereby incorporated by reference herein.

FIELD OF THE INVENTION

The present invention relates to the art of semiconductor manufacture, and in particular to the formulation of shallow source/drain (S/D) extensions and fully silicided metal gate electrodes using metal silicide technology.

DESCRIPTION OF THE RELATED ART

At least two competing aims exist in the semiconductor fabrication industry. One aim, which is motivated by the trend toward miniaturization, is to increase device density on semiconductor chips or dice. Another aim, which is motivated by increasing demand for computing power, is increased device speed. These aims stand in tension with one another because, as feature sizes decrease, the effects of resistivity increase, which results in decreased device speed.

One source of resistivity in semiconductor circuits is the junction between doped silicon regions (such as source/drain and electrode regions) and metal connects. As device sizes decrease, resistivity rises in inverse proportion with respect to junction surface areas. Thus, resistivity becomes increasingly problematic as device size decreases.

The problem of resistivity has been addressed in the semiconductor fabrication industry in part by providing metal-silicon alloy connections between semiconductors and metal connects. Such metal silicon alloys are known as metal silicides. Among the known metal silicides are aluminum silicide, cobalt silicide, titanium silicide and nickel silicide. Metal suicides not only have low resistivities in and of themselves, they also provide gradual transitions between metal connects and doped-silicon source/drain (S/D) regions and gate electrodes of MOS devices. These gradual transitions reduce junction losses, and result in MOS devices with increased speed potential.

A typical MOS device 10 having silicide regions 108a, 108b, 114 over S/D regions 18a, 18b, and gate electrode 14, respectively, is depicted in FIG. 1. The MOS device 10 further comprises substrate 22, doped electrode region 104 and spacers 106. The MOS device 10 is generally fabricated as follows. First, a precursor MOS device is provided, comprising substrate 12, dielectric 16, gate electrode 14, and spacers 106. The substrate 12 is typically single crystal silicon or doped silicon. Dielectric 16 generally comprises an insulative material such as $SiO_2$ or SiN. Gate electrode 14 is generally polysilicon. Spacers 106 may be an insulative material such as $SiO_2$, SiON or SiN. The precursor MOS device is then subjected to light ion implantation by ion bombardment at about 1–10 KeV with a suitable dopant ion, such as As, B or $BF_2$ at about $10^{14}$ to about $2\times10^{15}$ ion/cm$^2$, followed by Rapid Thermal Anneal (RTA) at temperatures above 1000° C. for about 5 to about 30 seconds to form lightly doped extensions reaching under dielectric 16. This is followed by heavy ion implantation by ion bombardment at about 30–60 KeV with a suitable dopant ion, such as P or As, at about $10^{15}$ to about $10^{16}$ ion/cm$^2$, followed by Rapid Thermal Anneal (RTA) at about 400° C. to about 600° C., to form heavily doped regions. Together, the lightly doped extension and heavily doped regions form S/D regions 18a, 18b. As a result of the two implantation and activation steps, a doped region 104 is also formed in an upper portion of gate electrode 14. Metal silicide regions 108a, 108b, 114, are formed by depositing a suitable silicide-forming metal on the surface of MOS device 10, followed by RTA, and then metal stripping to remove unreacted metal.

A typical MOS device 10 according to the prior art as depicted in FIG. 1 provides faster operation than is available without metal silicide junctions, but it also suffers from at least the following drawbacks. The prior art device 10 suffers from gate depletion at the gate/dielectric interface. Furthermore, the prior art device 10 suffers from dopant penetration, especially boron penetration.

Conceptually, the drawbacks of gate depletion and dopant penetration could be overcome by providing a metal gate electrode. However, prior art methods of fabricating metal gate electrodes have focused on depositing, patterning, and etching metal electrodes. These methods are complicated and expensive, and other methods of forming metal gate electrodes are therefore desirable.

In concept, metal-alloy gate electrodes, such as fully silicided gate electrodes, should overcome the drawbacks of gate depletion and dopant penetration. However, it is difficult to control diffusion of dopant ions under the RTA conditions necessary to produce fully silicided gate electrodes. In fact, efforts to provide fully silicided metal electrodes, wherein extensions are made by light ion implantation and extension, have failed to produce devices having both fully silicided gate electrodes and shallow extensions having depths of less than about 500 Å. Thus, the need to keep extension depth less than about 500 Å has heretofore prevented extending silicidation methodology to provide fully metal silicided gate electrodes.

SUMMARY OF THE INVENTION

There is therefore a need in the art to provide a semiconductor device having a gate electrode that is not subject to gate electrode/gate dielectric interface depletion, and methods of fabricating such a device. There is also a need in the art to provide a semiconductor device that is not subject to dopant penetration of the gate dielectric, and methods of fabricating such a device. There is further a need in the art to provide a semiconductor device with shallow S/D extensions, having extension depths of less than about 500 Å, and methods of fabricating such a device.

These and other needs are met by embodiments according to the present invention, which provide a semiconductor device having a fully silicided gate electrode and shallow S/D extensions with extension depths of less than about 500 Å, and a method of fabricating such device, which comprises providing a precursor device comprising substrate, dielectric, spacer, and polysilicon gate electrode; overlaying the precursor device with a layer of α-silicon (α-Si); introducing dopant into the α-Si; overlaying the α-Si layer with a layer of a metal capable of forming a silicide; rapid thermal annealing to form a metal silicide layer; whereby dopant segregates from the metal silicide into the substrate; stripping off unreacted metal, metal silicide, and spacer to form a device having shallow source/drain regions; subjecting the precursor device to deep source/drain junction formation by ion implantation and rapid thermal annealing; overlaying the precursor device with a layer of metal capable of forming a silicide; and subjecting the precursor device to rapid thermal annealing to form a fully metal silicided gate electrode and metal silicide regions overlaying the active source/drain regions of the device.

The foregoing and other features, aspects and advantages of the present invention will become more apparent from the following detailed description of the invention when taken in conjunction with the accompanying drawings.

DETAILED DESCRIPTION OF THE INVENTION

The present invention addresses problems related to gate depletion at the electrode/gate dielectric interface, dopant penetration of the gate dielectric, and forming shallow S/D junction. These and other problems are solved, in part, by the present invention, which provides fully silicided gate electrodes through formation of a silicide, removal of the silicide, and further silicidation to form a fully silicided gate electrode.

The present invention can be understood by reference to particular embodiments depicted in FIGS. 2–12. The ordinary artisan will appreciate, however, that other embodiments are possible within the scope of the present description and claims, and are contemplated as being within the scope of the present invention.

Figure 1:
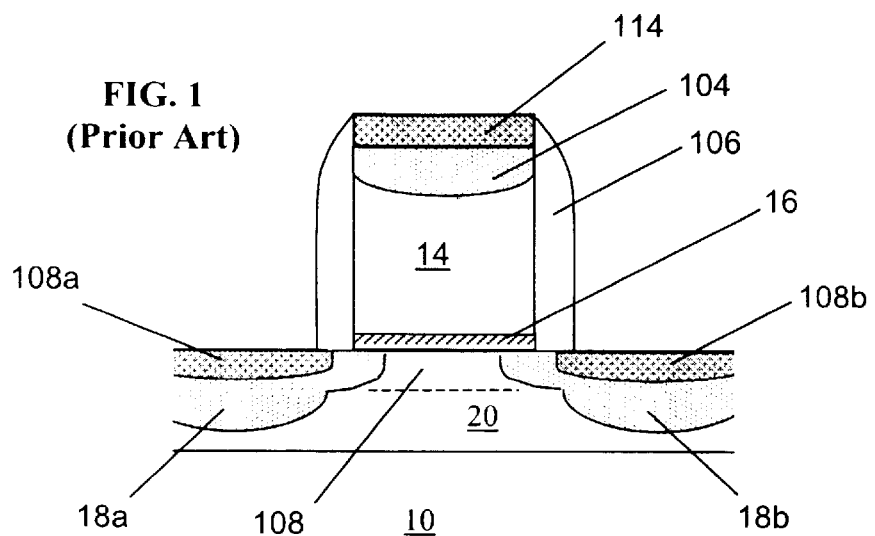
FIG. 1 depicts a typical prior art semiconductor having implanted and extended S/D junctions.
Figure 2:
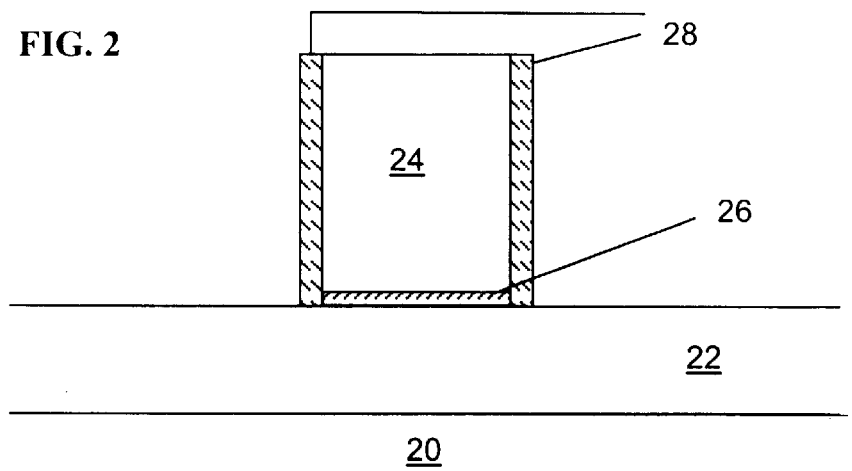
FIGS. 2 through 11 depict embodiments according to the present invention at various stages of fabrication.

FIG. 2 depicts a precursor semiconductor device 20 to be processed according to the present invention. Semiconductor device 20 starts with a substrate material 22, a gate electrode 24, a gate dielectric 26 and a spacer 28.

The silicon substrate 22 is advantageously any suitable silicon substrate. In certain embodiments of the present invention, the silicon substrate 22 is a single silicon crystal. In other embodiments, according to the present invention the silicon substrate is a p-doped silicon substrate, an n-doped silicon substrate, or an insulated silicon substrate. Advantageously, the silicon substrate 22 will have formed on it a plurality of semiconductor devices such as MOS transistors, diodes, resistors, capacitors, and their associated connects to form an integrated circuit chip (die). In certain embodiments of the present invention, substrate 22 is boron-doped silicon.

The gate dielectric layer 26 is a layer of electrically insulating material, such as $SiO_2$, SiN, or SiON. Advantageously gate dielectric 26 is a silicon dioxide layer. The gate dielectric layer 26 is formed by any suitable method of forming a silicon dioxide layer. In some embodiments according to the present invention, the gate dielectric 26 is formed by local oxidation of silicon (LOCOS). In other embodiments according to the present invention, the gate dielectric layer is formed by other suitable methods of depositing a silicon dioxide layer, such as chemical vapor deposition (CVD). In still further embodiments according to the present invention, the gate dielectric layer 26 consists of silicon nitride (SiN), which is applied to the silicon substrate 22 by any appropriate method recognized in the art. In any case, the gate dielectric 26 is advantageously from about 30 to about 200 Å thick.

The gate electrode 24 is advantageously formed from a polysilicon layer deposited on the gate dielectric 26. The gate electrode 24 is advantageously deposited by a chemical vapor decomposition (CVD) method, followed by patterning and etching. In some embodiments according to the present invention, the gate electrode 24 is a pure polysilicon layer, while in other embodiments according to the present invention, gate electrode 24 is partially or completely doped with n-type or p-type dopants, depending on whether the source/drain dopant is n-type or p-type. Suitable dopants for the gate electrode 26 include arsenic (As), boron (B) and phosphorous (P).

The spacers 28 are formed from an insulating material such as silicon dioxide ($SiO_2$), silicon nitride (SiN), or silicon oxynitride (SiON). The spacers 28 provide electrical isolation between gate electrode 24 and other device components, such as active source/drain regions and connects. The spacers 28 are advantageously deposited and patterned by any art recognized method, such as CVD followed by anisotropic etching. The spacers 28 are advantageously about 50 Å to about 250 Å thick.

The precursor device 20 as depicted in FIG. 2 is advantageously made by any conventionally known, art recognized method. In certain embodiments according to the present invention, the device 20 is prepared by providing a silicon substrate 22, depositing a silicon dioxide layer on the surface of silicon substrate 22, depositing a polysilicon layer on the silicon dioxide layer, patterning and etching the polysilicon and silicon dioxide layers to form gate dielectric 26 and gate electrode 24, depositing silicon dioxide or silicon nitride by conformal deposition, and anisotropically etching the deposited silicon dioxide to form spacers 28 of about 50 Å to about 250 Å thickness.

Figure 3:
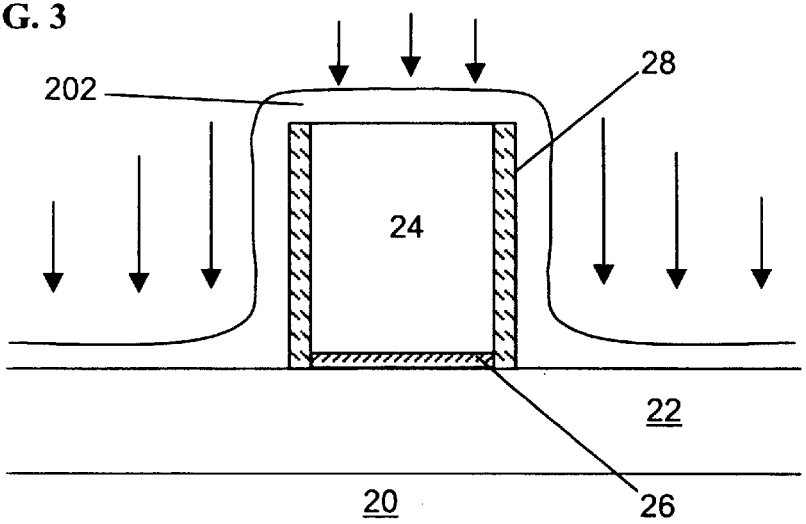

The device 20 is then subjected to ion implantation as depicted in FIG. 3. First, α-Si layer 202 is deposited on the surfaces of substrate 22, gate electrode 24, and spacer 28, by CVD, PCVD or PVD, for example to a depth of about 100 Å to about 500 Å. Ion implantation is then carried out at about 10 to about 100 KeV, and ion dosages of about $10^{13}$–$10^{16}$ ions/$Cm^2$. Suitable dopants include As and P for NMOS devices and B and $BF_2$ for PMOS devices. In certain embodiments according to the present invention, the species of ion used in the ion implantation of α-Si layer 202 comprises As ions deposited at energies of about 10 to about 60 KeV, and ion densities of about $10^{15}$ to about $10^{16}$ ions/$cm_2$.

Figure 4:
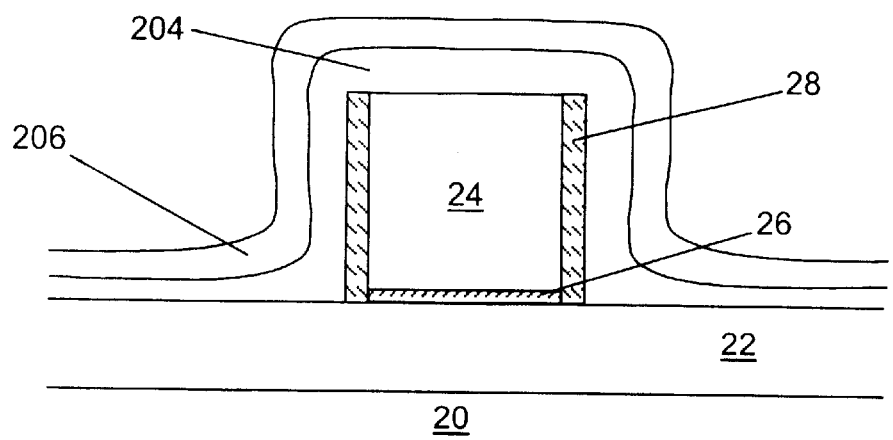

The resulting doped α-Si layer 204 is depicted in FIG. 4. After ion implantation to form α-Si layer 204, metal layer 206 is deposited over α-Si layer 204 to a depth of about 100 Å to about 300 Å. The metal layer advantageously comprises Ni atoms, other metals being possible within the scope of the present invention. For instance, Co and Ti are other suitable metals for forming silicides. The metal layer 206 is advantageously deposited by any art recognized method. In certain embodiments according to the present invention, the metal layer 206 is an Ni layer deposited by sputtering. A suitable device for accomplishing sputtering is the Endura® sputtering reactor manufactured by Applied Materials, Inc. of Santa Clara, Calif.

Figure 5:
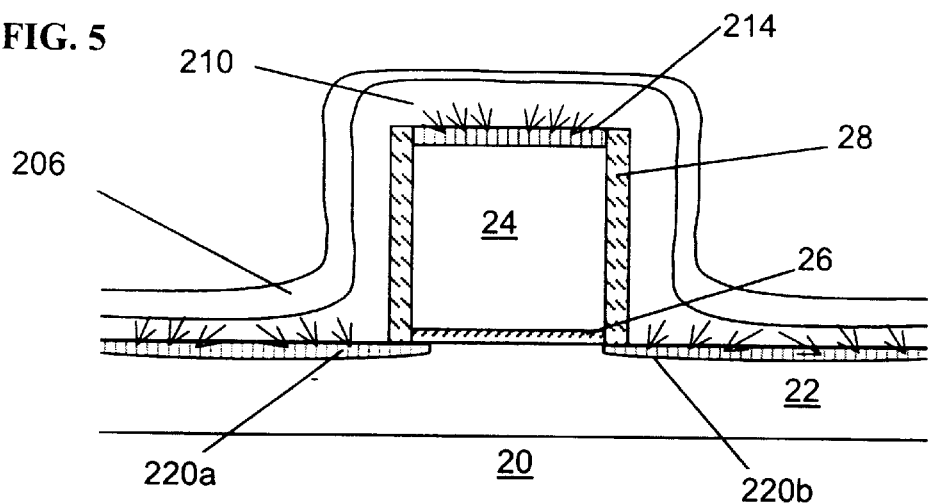

After deposition of metal layer 206, device 20 is subjected to rapid thermal annealing (RTA) at about 400° C. to about 600° C., for about 5 seconds to about 30 seconds. The results of this RTA step are shown in FIG. 5. During the RTA step, the metal, such as nickel, in metal layer 206 reacts with the silicon in doped α-Si layer 204 to form a silicide layer 210 over the surface of substrate 22 and gate electrode 24. The small arrows in FIG. 5 depict the motion of dopant atoms as they segregate out of metal silicide layer 210 and into the underlying substrate 22 and electrode 24. Unreacted metal 206 remains over the metal silicide layer 210. As dopant diffuses into substrate 22 it forms shallow doped silicon regions 220a, 220b. As dopant diffuses into gate electrode 24, it forms doped electrode region 214. A suitable RTA tool for performing the RTA step is the Centura® rapid thermal processing tool, provided by Applied Materials, Inc. of Santa Clara, Calif.

Where the metal layer 206 comprises nickel as its major constituent, metal silicide layer 210 comprises nickel silicide (NiSi). Where the metal layer 206 comprises other silicide forming metals, such as Co, Al or Ti, different metal silicides are formed. For instance, where the metal layer 206 comprises Ti, the metal silicide layer 210 comprises titanium silicide (TiSi), where the metal layer 206 comprises Co, the metal silicide layer 210 comprises CoSi.

After the RTA step in which extensions 220a, 220b are formed, the unreacted metal layer 206, metal silicide layer 210 and spacers 28 are stripped off. Stripping is advantageously carried out by any art recognized method, or combination of methods. For instance, a 4:1 mixture of $H_2SO_4$ and $H_2O_2$ is suitable for stripping off the unreacted metal layer 206, and a mixture of ammonium peroxide and hydrogen peroxide (AMP) is suitable for selectively etching off the metal silicide layer 206 and spacers 208.

Figure 6:
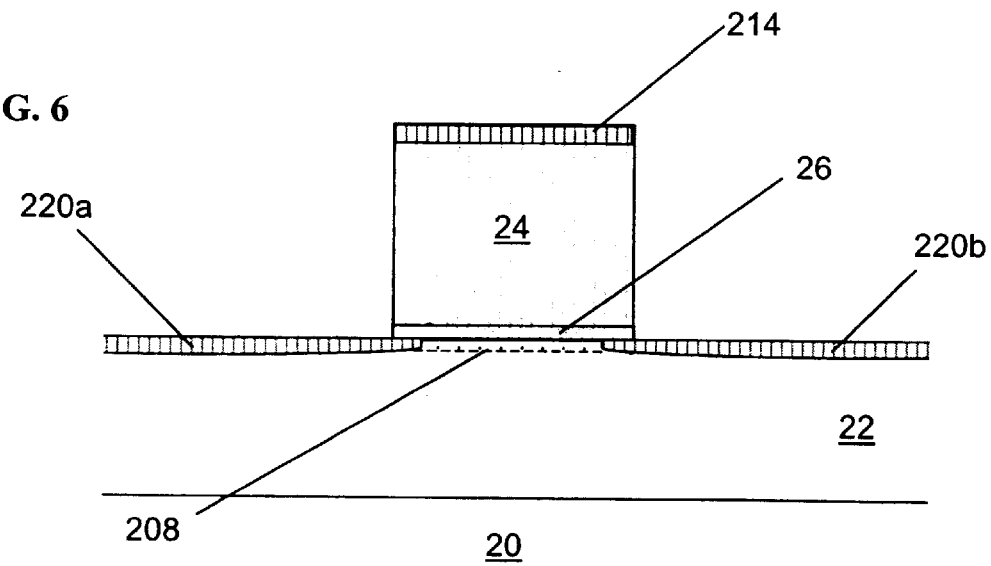

Device 20 is depicted in FIG. 6, after selective removal of unreacted metal layer 206, metal silicide layer 210 and spacers 28. Shallow S/D extensions 220a, 220b lie to the lower right and left of gate dielectric 26. The shallow S/D extensions 220a, 220b have the advantage of being relatively shallow as compared to prior art S/D extensions. Because the S/D extensions 220a, 220b were formed by diffusion of ions from the overlying NiSi layers, rather than by high energy implantation, the borders of S/D extensions 220a, 220b are significantly shallower than those formed by ion implantation. Moreover, because the S/D extensions 220a, 220b are formed by diffusion, rather than high energy implantation and annealing, it is easier to control their depth.

Figure 7:
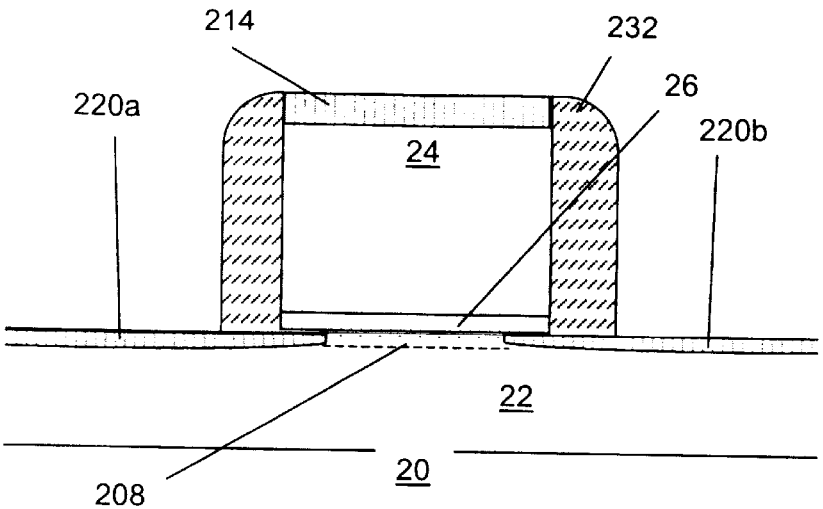

Device 20 is shown in FIG. 7 after addition of spacers 232. Spacers 232 provide protection for the sides of gate electrode 24, while also providing electrical isolation for gate electrode 24 from other circuit components. Spacers 232 are advantageously about 600 Å to about 1500 Å thick. In some embodiments according to the present invention, the spacers are $SiO_2$, while in other embodiments according to the present invention the spacers are SiN or SiON. The spacers are deposited by any art recognized method, such as chemical vapor deposition (CVD). The spacers are then patterned and etched via anisotropic etching.

Figure 8:
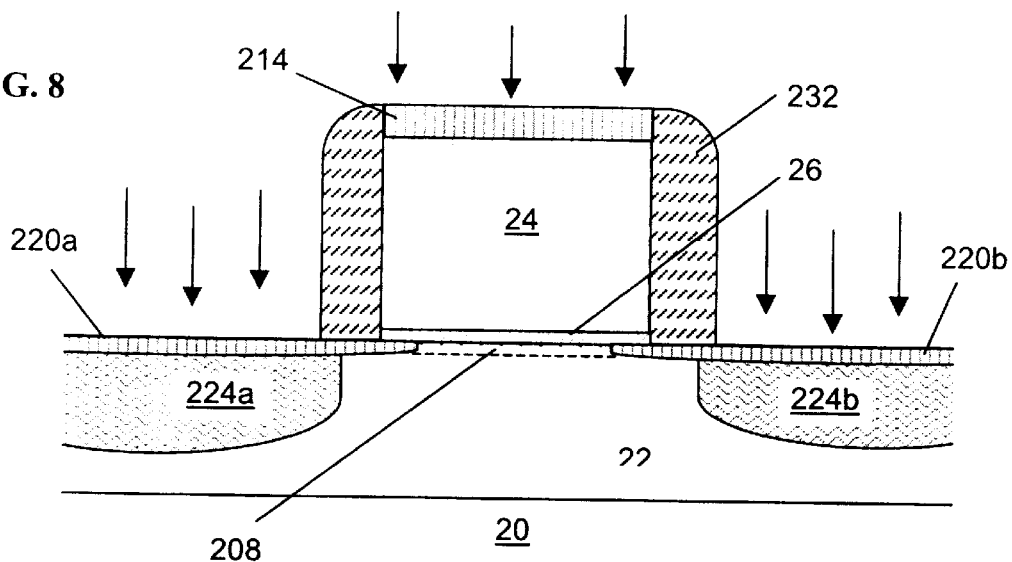

Ion implantation is then performed at energies of about 10 to about 100 KeV, and ion densities of $10^{13}$–$10^{16}$ ions/cm$^2$, as shown in FIG. 8. Exemplary ions are As, B, $BF_2$, depending on whether a PMOS or NMOS device is desired. In particular embodiments according to the present invention, the ion is As, implanted at an energy of about 30 to about 60 KeV and a dosage of about $10^{15}$ to about $10^{16}$ ions/cm$^2$. Activation is then accomplished by way of rapid thermal annealing, advantageously at a temperature of about 400° C. to about 600° C., for about 5 seconds to about 30 seconds. In certain embodiments according to the present invention, RTA is conducted at about 450° C. to about 550° C. for about 5 seconds to about 30 seconds.

Figure 9:
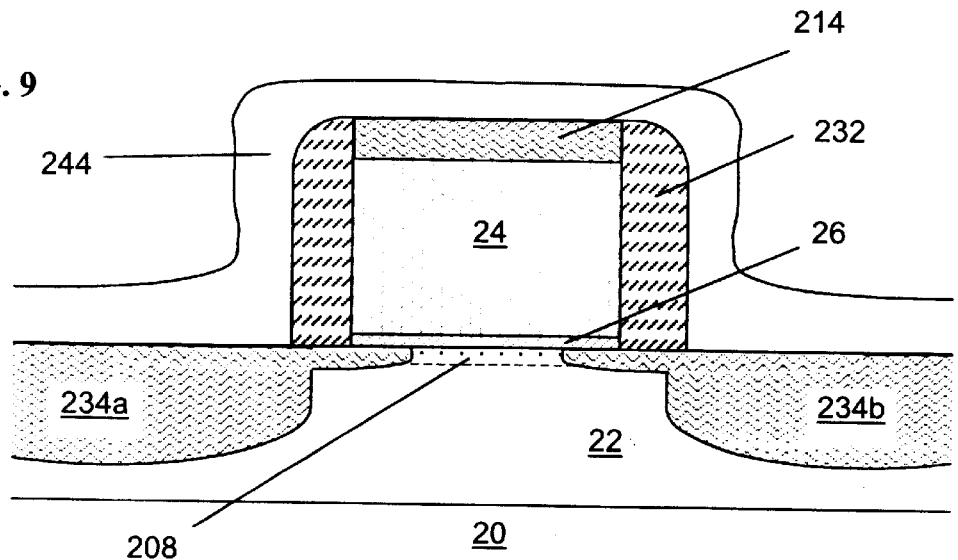

After ion implantation and activation, a metal layer 244, such as a nickel layer, is deposited on the surface of device 20, as depicted in FIG. 9. For the sake of simplicity, S/D extension 220a and heavily doped S/D region 224a are depicted as a single S/D junction 234a. Likewise, S/D extension 220b and heavily doped S/D region 224b are depicted as a single S/D junction 234b. In certain embodiments of the present invention, metal layer 244 is a layer comprising nickel metal. In other embodiments according to the present invention, the metal layer 244 comprises another metal capable of forming a metal silicide, such as Co, Al or Ti. Mixtures of silicide-forming metals are advantageously employed in some embodiments according to the present invention. The metal layer 244 is deposited to a depth sufficient to ensure complete silicidation of the gate electrode 24. In some embodiments according to the present invention, the metal layer 244 is between 25 Å and 350 Å deep. In certain embodiments according to the present invention, the metal layer 244 is from about 100 Å to about 300 Å deep.

The metal layer 244 is advantageously deposited by any art recognized method. In certain embodiments according to the present invention, the metal layer 244 comprises Ni deposited by sputtering to a depth of about 150 Å to about 250 Å. A suitable device for accomplishing the sputtering is the Endura® sputtering reactor manufactured by Advanced Materials of Santa Clara, Calif.

After deposition of the metal layer 244, the device 20 is subjected to rapid thermal annealing. Rapid thermal annealing is advantageously carried out by heating the device 20 to temperatures of about 400° C. to about 600° C. for a period of about 5 seconds to about 30 seconds. In particular embodiments according to the present invention, the RTA step is conducted at about 500° C. for about 10 to about 30 seconds in an inert atmosphere, such as under nitrogen ($N_2$) gas. A suitable RTA tool for performing the RTA step is the aforementioned Centura® rapid thermal processing tool, provided by Applied Materials, Inc. of Santa Clara, Calif.

Figure 10:
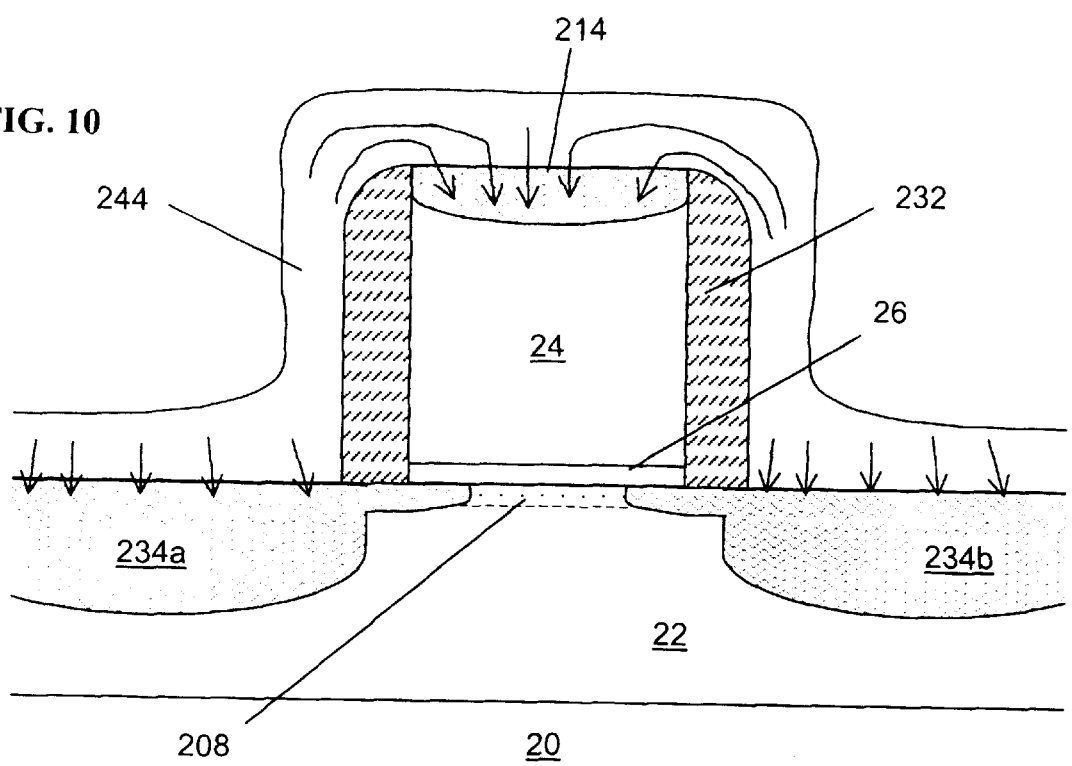

During the rapid thermal annealing step, metal in metal layer 244 diffuses into, and reacts with, silicon in electrode 24 and S/D junctions 234a, and 234b. This reaction is depicted in FIG. 10. The small arrows in FIG. 10 show the diffusion of metal atoms into source/drain junctions 234a, 2434b and the gate electrode 24. These metal atoms, such as Ni atoms, react with the silicon in the S/D junctions 234a, 234b and gate electrode 24 to form metal silicides, such as NiSi. After the rapid thermal annealing step the unreacted metal layer 244 is stripped off. Advantageously, selective stripping of unreacted metal is accomplished with a 4:1 solution of $H_2SO_4$ and $H_2O_2$.

Figure 11:
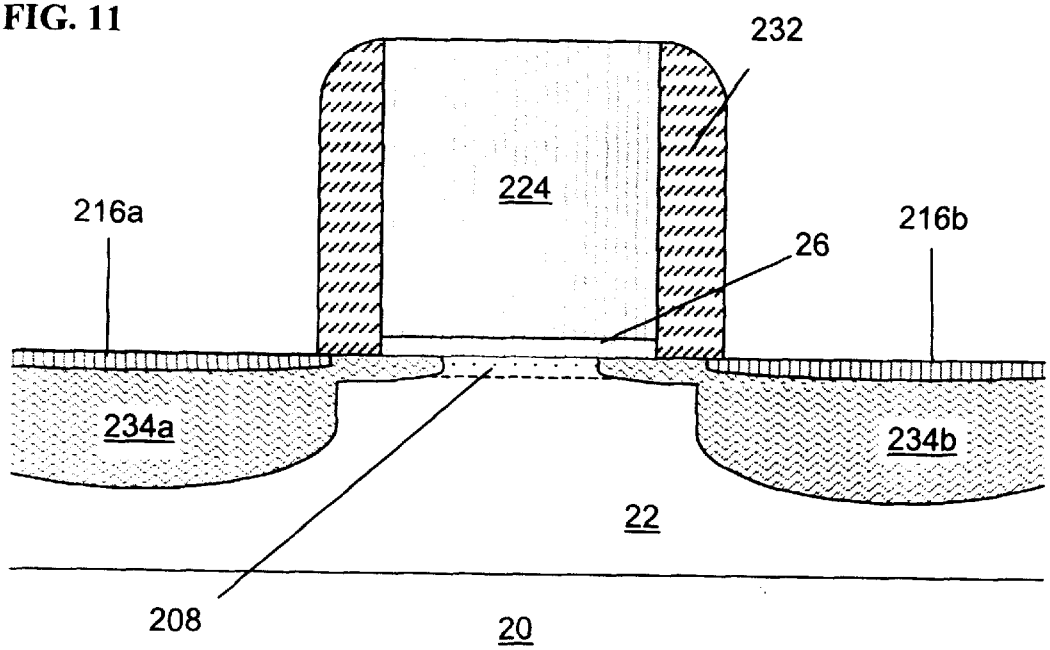

Advantageously, electrode 24 is completely converted from polysilicon to metal silicide, such as NiSi. This fully metal silicided gate electrode 224 is depicted in FIG. 11.

A fully metal silicided electrode according to the present invention possesses distinct advantages over prior art polysilicon gate electrodes. First, the fully metal silicided gate does not experience depletion at or near the gate electrode/gate dielectric interface. Additionally, the metal silicide gate electrode 244 does not experience penetration of dopant, especially boron, across the dielectric 26. Accordingly, a metal silicide gate electrode 244 is more resilient than a conventional doped polysilicon electrode. A device 20 according to the present invention will thus tolerate higher voltages, such as transient forward bias voltages that, and reverse bias voltage spikes, that would render conventional semiconductor devices inoperative.

Figure 12:
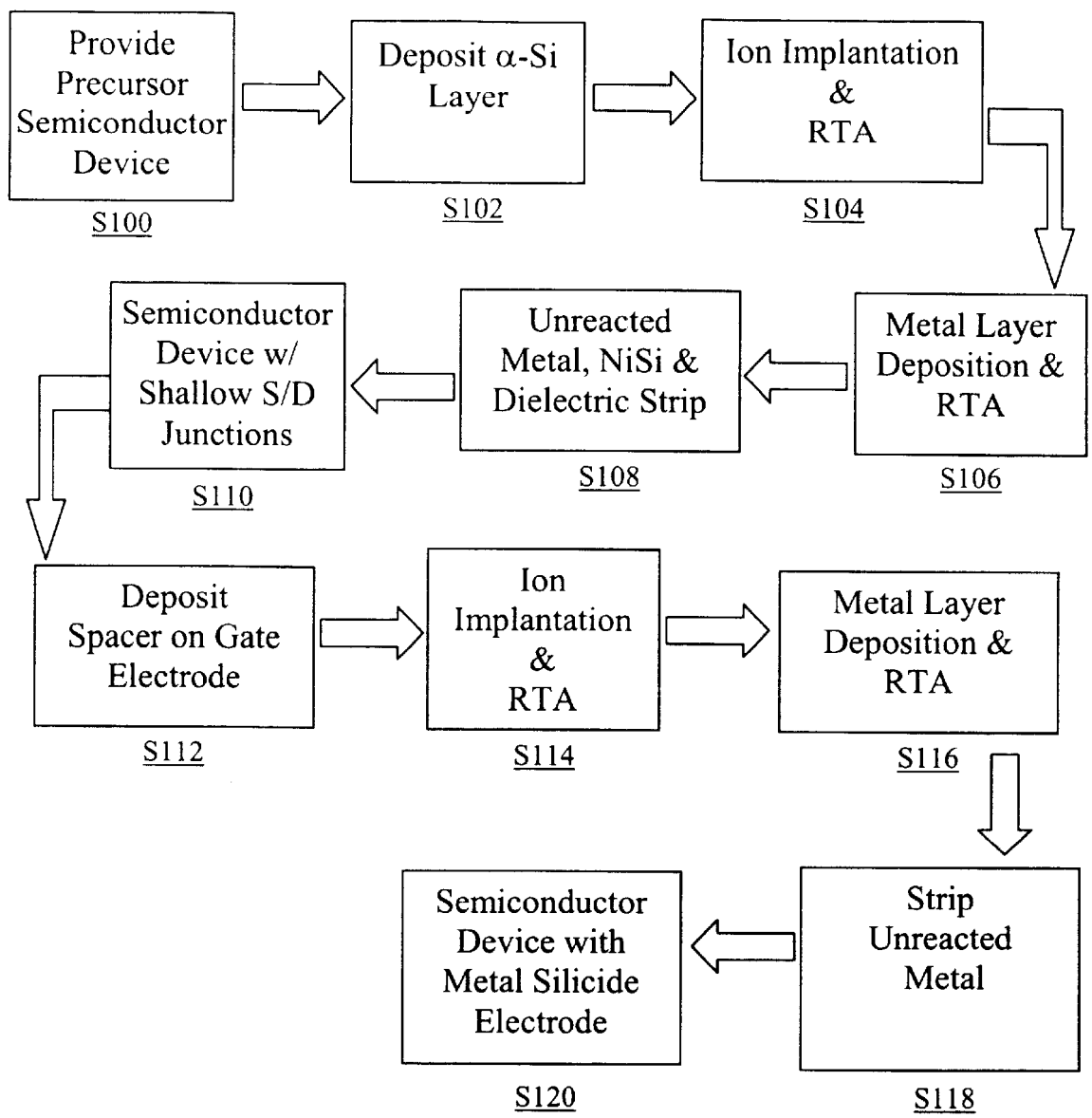
FIG. 12 is a block diagram of a depicting process according one embodiment of the present invention.

A method of manufacturing a semiconductor device having both shallow S/D extensions and fully metal silicide gate electrodes is summarized in block diagram form in FIG. 12. A method of making a semiconductor device having both shallow source/drain regions and fully metal silicided gate electrode comprises S100 through S120, as described below.

In S100, a precursor semiconductor device is provided as described above with reference to FIG. 2. The intermediate semiconductor device comprises a semiconductor substrate, such as B-doped silicon, a dielectric comprising, for instance $SiO_2$ or SiN, a spacer comprising, for instance, $SiO_2$, SiN or SiON, and a gate electrode comprising doped or undoped polysilicon. The device has a surface comprising the outer surfaces of the substrate, gate electrode and spacer. In S102 a layer of α-Si is deposited on the surface of the precursor device as described with reference to with reference to FIG. 3, above. In S104 the layer of α-Si is implanted with dopant, such as As, as described above with reference to FIG. 3. A layer of metal capable of forming a silicide, such as Ni, is then deposited over the x-Si layer and the device is subjected to rapid thermal annealing in S106, as described above, with reference to FIGS. 4 and 5. Unreacted metal, metal silicide and dielectric are then stripped/etched off in S108, as described above, with reference to FIG. 6. A semiconductor device with shallow S/D extensions is thus obtained in S110. A device according to the present invention is next provided with a spacer in S112, as described above with respect to FIG. 7. Then the semiconductor device is subjected to dopant ion implantation and rapid thermal annealing in S114, as described above with reference to FIG. 8. Next, a layer of metal capable of forming a metal silicide is deposited over the device surface, followed by rapid thermal annealing in S116, as described above with reference to FIGS. 9 and 10. Finally, unreacted metal is stripped from the device in S118 to produce a semiconductor device having a fully metal silicide gate electrode in S120, as described above with reference to FIG. 11.

The present invention provides a method of fabricating a semiconductor device having a fully silicided gate electrode and shallow S/D extensions, having extension depths of less than about 500 Å.

A semiconductor device according to the present invention offers the combined advantages of smaller size and increased device speed. A metal silicide gate offers increased speed and reliability by combining the advantages of reduced or eliminated gate depletion and reduced or eliminated dopant penetration. A metal silicide gate according to the present invention is formed by methods that are simpler and more economical than prior art methods involving deposition, patterning and etching of metal electrodes. Shallow S/D extensions having depths of less than about 500 Å offer faster operation with reduced leakage current. A method of making shallow S/D extensions according to the present invention provides greater control over S/D extension depth than is possible with prior art methods involving direct implantation of dopant ions. A semiconductor device according to the present invention thus offers the combined advantages of both fully metal silicided gate electrodes and shallow S/D extensions having depths of less than about 500 Å.

It is to be understood that while this invention has been described with reference to certain embodiments, other embodiments are possible within the scope of the present invention.

What is claimed is:

1. A method of manufacturing a semiconductor device having a fully silicided gate electrode and shallow S/D extensions comprising:

(a) providing a precursor semiconductor device comprising a substrate, a gate dielectric, a gate electrode and a spacer;

(b) depositing a layer of α-Si on the surface of the precursor semiconductor device;

(c) implanting dopant ions into the α-Si layer and activating to form a doped α-Si layer;

(d) depositing a layer of a metal capable of forming a silicide over the doped α-Si layer;

(e) annealing the device to form a metal silicide layer from which dopant segregates to form shallow S/D extensions;

(f) removing unreacted metal, metal silicide and spacer;

(g) implanting additional dopant ions and activating to form deep, highly doped S/D junctions;

(h) depositing a layer of metal capable of forming a metal silicide on the device;

(i) annealing the device to form a fully metal silicided gate electrode; and (j) removing unreacted metal to form a semiconductor device having fully silicided gate electrode and shallow S/D extensions.

2. A method according to claim 1, wherein the S/D extensions have depths of less than about 500 Å.

3. A method of claim 1, wherein the metal capable of forming a silicide comprises nickel.

4. A method of claim 1, wherein the dopant comprises As.

5. A method of claim 1, wherein the gate dielectric comprises $SiO_2$.

6. A method of claim 1, wherein the gate dielectric comprises SiN.

7. A method of claim 1, wherein activation is carried out by rapid thermal annealing at about 400° C. to about 600° C. for about 5 seconds to about 30 seconds.

8. A method according to claim 1, wherein metal silicide is removed by selective etching with a composition comprising ammonium hydroxide and peroxide.

9. A method according to claim 1, wherein unreacted metal is selectively removed by stripping with a composition comprising $H_2SO_4$ and $H_2O_2$.

10. A method according to claim 1, wherein the layer of α-Si is about 100 Å to about 400 Å deep.

11. A semiconductor device comprising a substrate, a gate dielectric, a gate electrode, spacers, and S/D junctions, wherein the gate electrode is a fully metal silicided gate electrode.

12. A semiconductor device according to claim 11, further comprising metal silicide layers on the S/D junctions.

13. A semiconductor device according to claim 11, wherein the S/D junctions comprise S/D extensions having a depth of less than about 500 Å.

14. A semiconductor device according to claim 11, wherein the metal silicide comprises nickel silicide.

15. A semiconductor device according to claim 11, wherein the gate dielectric comprises $SiO_2$, SiN or SiON.

16. A semiconductor device according to claim 11, wherein the spacers comprise $SiO_2$, SiN or SiON.

17. A semiconductor device according to claim 11, wherein the substrate is single crystal silicon.

18. A semiconductor device according to claim 11, wherein the substrate is boron-doped silicon.

* * * * *